(12) United States Patent
Jang et al.

(10) Patent No.: US 8,368,439 B2
Jang et al.
(45) Date of Patent: Feb. 5, 2013

(54) PHASE LOCKED LOOP CIRCUIT, METHOD OF DETECTING LOCK, AND SYSTEM HAVING THE CIRCUIT

(75) Inventors: Tae-Kwang Jang, Seoul (KR); Jae-Jin Park, Seongnam-si (KR); Ji-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/049,474

(22) Filed: Mar. 16, 2011

(65) Prior Publication Data

US 2011/0227616 A1     Sep. 22, 2011

(30) Foreign Application Priority Data

Mar. 18, 2010   (KR) .................. 10-2010-0024402

(51) Int. Cl.
*H03L 7/06* (2006.01)
(52) U.S. Cl. ..................... 327/156; 327/147
(58) Field of Classification Search .................. 327/147, 327/156
See application file for complete search history.

(56) References Cited

U.S. PATENT DOCUMENTS

| | | | |
|---|---|---|---|
| 5,008,635 A * | 4/1991 | Hanke et al. | 331/1 A |
| 5,189,379 A * | 2/1993 | Saito et al. | 331/1 A |
| 5,327,103 A * | 7/1994 | Baron et al. | 331/1 A |
| 6,115,438 A | 9/2000 | Andresen | |
| 6,744,838 B1 * | 6/2004 | Dixit | 375/373 |
| 7,183,861 B2 * | 2/2007 | Jung | 331/1 A |
| 7,424,082 B2 * | 9/2008 | Choi | 375/371 |
| 8,013,641 B1 * | 9/2011 | Lee et al. | 327/107 |
| 8,040,156 B2 * | 10/2011 | Lee et al. | 327/20 |
| 8,067,968 B2 * | 11/2011 | Shin et al. | 327/158 |
| 2002/0175769 A1 * | 11/2002 | Wong et al. | 331/17 |
| 2008/0084233 A1 * | 4/2008 | Lee | 327/156 |
| 2009/0251226 A1 * | 10/2009 | Kathuria et al. | 331/1 R |
| 2010/0052752 A1 * | 3/2010 | Lee et al. | 327/159 |
| 2011/0227616 A1 * | 9/2011 | Jang et al. | 327/157 |
| 2011/0254601 A1 * | 10/2011 | Xiu | 327/157 |
| 2012/0025883 A1 * | 2/2012 | Lin | 327/158 |

FOREIGN PATENT DOCUMENTS

| | | |
|---|---|---|
| JP | 03-206725 | 9/1991 |
| JP | 2003-273851 | 9/2003 |
| KR | 20-0145767 | 6/1999 |
| KR | 20-0145797 Y1 | 6/1999 |

* cited by examiner

*Primary Examiner* — Adam Houston
(74) *Attorney, Agent, or Firm* — Lee & Morse, P.C.

(57) ABSTRACT

Provided are a phase locked loop (PLL) circuit, a lock detector employable with a PLL circuit, a system including such a PLL circuit and/or lock detector, and a method of detecting a lock/unlock state of a PLL circuit. The PLL circuit may include a clock generating circuit configured to generate an output clock signal having a predetermined frequency in synchronization with a reference clock signal. The lock detector may be configured to determine that the PLL circuit is in a lock state when a phase difference between the reference clock signal and the output clock signal is equal to or less than a first reference value, determine that the PLL circuit is in an unlock state when the phase difference between the reference clock signal and the output clock signal is greater than a second reference value, and generate a lock detection signal.

20 Claims, 5 Drawing Sheets

PHASE LOCKED LOOP CIRCUIT, METHOD OF DETECTING LOCK, AND SYSTEM HAVING THE CIRCUIT

CROSS-REFERENCE TO RELATED APPLICATION

This application claims priority under 35 U.S.C. §119 to Korean Patent Application No. 10-2010-0024402 filed on Mar. 18, 2010, the disclosure of which is hereby incorporated by reference in its entirety.

BACKGROUND

1. Field

Embodiments of the inventive concept relate to a lock detector, a phase locked loop (PLL) circuit including such a lock detector, a method of detecting a lock, and a system including such a lock detector and/or PLL circuit. More particularly, embodiments relate to a lock detector configured to be capable of stably determining a lock state and an unlock state of a PLL circuit, a method of detecting a lock, and a system including such a lock detector and/or PLL circuit.

2. Description of the Related Art

In general, a phase locked loop (PLL) circuit may be a basic circuit included in an electronic system, which may generate an output clock signal having a desired frequency and transmit the output clock signal to internal circuits. The PLL circuit may be applied to many circuits configured to operate in synchronization with a clock signal. Meanwhile, the PLL circuit may continuously compare the phase of a reference clock signal with that of the output clock signal and allow the output clock signal to maintain a predetermined frequency using a frequency correction method.

Typically, circuits configured to receive the output clock signal from the PLL circuit may use the output clock signal only when the PLL circuit is in a lock state. Here, the lock state refers to a state where the phase of the output clock signal is equal to that of the reference clock signal. Since it is difficult to equalize the phase of the output clock signal to that of the reference clock signal, it is determined that the PLL circuit is in the lock state when a phase difference between the output clock signal and the reference clock signal is within a predetermined range. The PLL circuit may include a lock detection circuit configured to determine the lock state or an unlock state.

The lock detection circuit may compare the phase difference between the reference clock signal and the output clock signal with a reference value and determine that the PLL circuit is in the lock state when the phase difference between the reference clock signal and the output clock signal is less than the reference value. When the PLL circuit is in the lock state, internal circuits may receive the output clock signal and use the output clock signal as an internal clock signal.

However, variations in external factors, such as process, voltage, and temperature (PVT) factors may lead to a change in the reference value. For example, the reference value may become less than a value of jitter, which is an output noise typically caused by internal characteristics of the PLL circuit. In this case, when the jitter occurs, the lock detection circuit may mistake the lock state for the unlock state and output a wrong output signal. Conversely, when the reference value is increased due to external factors, the lock detection circuit may mistake the unlock state for the lock state and output a wrong output signal. As described above, when the reference value per se is changed due to the external factors, a malfunction may become highly likely to occur in the PLL circuit, and a system may be unstable.

SUMMARY

One or more embodiments may provide a lock detector configured to more stably determining a lock state or an unlock state of a PLL circuit in spite of noise, a PLL circuit including such a lock detector, and a method of detecting a lock, and a system including such a PLL circuit.

One or more embodiments may provide a phase locked loop (PLL) state detector employable with a PLL circuit including a clock generating circuit configured to generate an output clock signal having a predetermined frequency in synchronization with a reference clock signal, the PLL state detector, including a lock detector configured to determine that the PLL circuit is in a lock state when a phase difference between the reference clock signal and the output clock signal is equal to or less than a first reference value, determine that the PLL circuit is in an unlock state when the phase difference between the reference clock signal and the output clock signal is greater than a second reference value, and generate a lock detection signal. The second reference value may be greater than the first reference value.

The clock generating circuit of the PLL circuit may include a phase-frequency detector configured to generate an up signal and a down signal according to a phase difference between a division clock signal obtained by dividing the output clock signal and the reference clock signal, control a pulse width of the up signal when the phase of the division clock signal trails that of the reference clock signal, and control a pulse width of the down signal when the phase of the division clock signal leads that of the reference clock signal, a charge pump configured to pump a voltage according to the pulse widths of the up signal and the down signal and generate a control voltage, and a voltage-controlled oscillator (VCO) configured to vary the frequency of the output clock signal in response to the control voltage.

The lock detector may include a logic gate configured to generate phase difference data of which pulse width is controlled according to the phase difference between the reference clock signal and the output clock signal, a lock enable signal generator configured to determine that the PLL circuit is in the lock state when the pulse width of the phase difference data is equal to or less than the first reference value and enable a lock enable signal, an unlock enable signal generator configured to determine that the PLL circuit is in the unlock state when the pulse width of the phase difference data is greater than the first reference value and enable an unlock enable signal, and an SR latch configured to enable the lock detection signal in response to the lock enable signal and disable the lock detection signal in response to the unlock enable signal.

The lock enable signal generator may include a first inversion delay unit configured to delay the phase difference data by the first reference value, invert the delayed phase difference data, and generate a first delay signal, a first D-flip-flop configured to output the phase difference data in synchronization with the first delay signal, and a first debouncer configured to remove a noise component from an output signal of the first D-flip-flop and output the lock enable signal.

The unlock enable signal generator may include a second inversion delay unit configured to delay the phase difference data by the second reference value, invert the delayed phase difference data, and generate a second delay signal, a second D-flip-flop configured to output the phase difference data in synchronization with the second delay signal, and a second debouncer configured to remove a noise component from an output signal of the second D-flip-flop and output the unlock enable signal.

The lock enable signal generator may include an inversion chain having an n inverters, and the unlock enable signal generator includes an inversion chain having an m inverters, where n and m are odd numbers and m is greater than n.

The logic gate may be a NOR gate.

One or more embodiments provide a system, including a clock generating circuit configured to generate an output clock signal having a predetermined frequency in synchronization with a reference clock signal, a lock detector configured to determine that the system is in a lock state when a phase difference between the reference clock signal and the output clock signal is equal to or less than a first reference value and determine that the system is in an unlock state when the phase difference between the reference clock signal and the output clock signal is greater than a second reference value, and an internal circuit configured to perform an internal operation in synchronization with the output clock signal when the system is in the lock state.

One or more embodiments provide a lock detection method of a phase locked loop (PLL) circuit, including a clock generating circuit configured to generate an output clock signal having a predetermined frequency in synchronization with a reference clock signal, and a lock detector configured to determine that the PLL circuit is in a lock state or in an unlock state according to a phase difference between the reference clock signal and the output clock signal, and generate a lock detection signal, the method including determining that the PLL circuit is in the lock state when the phase difference between the reference clock signal and the output clock signal is equal to or less than a first reference value and enabling the lock detection signal, and determining that the PLL circuit is in the unlock state when the phase difference between the reference clock signal and the output clock signal is greater than a second reference value and disabling the lock detection signal.

The method may further include, after determining that the PLL circuit is in the lock state, maintaining the determination that the PLL circuit is in the lock state when the phase difference between the reference clock signal and the output clock signal is equal to or less than the first reference value and the lock detection signal is disabled.

Determining that the PLL circuit is in the unlock state, after being in the lock state, may be based only on the whether the phase difference between the reference clock signal and the output clock signal is greater than the second reference value.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity. Like reference terms refer to like elements throughout the specification.

It will be understood that the term "and/or" includes any and all combinations of one or more of the associated listed items. It will be understood that, although the terms first, second, third, etc. may be used herein to describe various elements, these elements not be limited by these terms. These terms are only used to distinguish one element from another. Thus, a first element discussed below could be termed a second element without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a phase locked loop (PLL) circuit and a system including the same according to exemplary embodiments of the inventive concept will be described with reference to the appended drawings.

Figure 1:
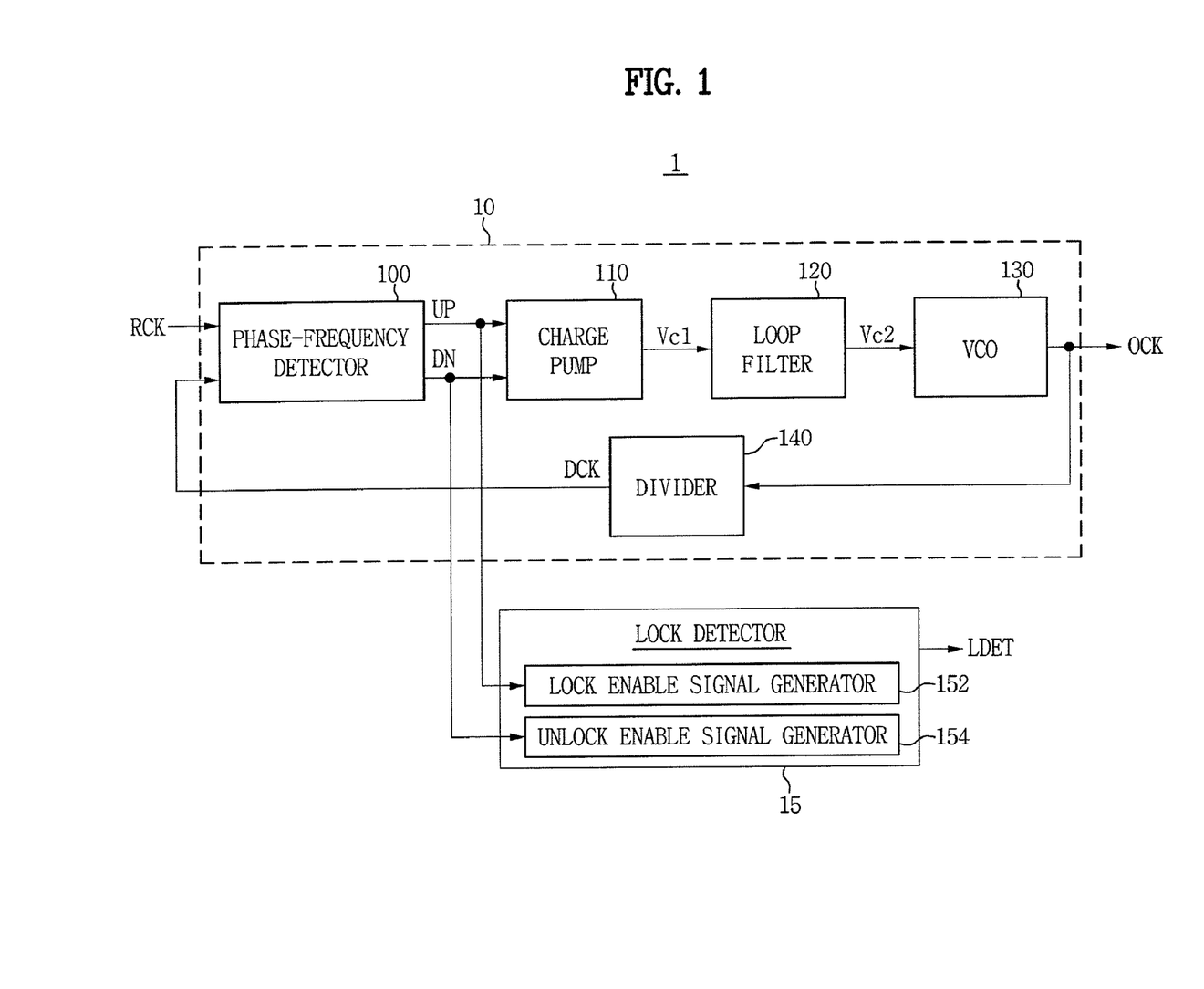
FIG. 1 illustrates a block diagram of an exemplary embodiment of a phase locked loop (PLL) circuit.

FIG. 1 illustrates a block diagram of an exemplary embodiment of a phase locked loop (PLL) circuit 1.

Referring to FIG. 1, the PLL circuit 1 may include a clock generating circuit 10 and a lock detector 15. Also, the clock generating circuit 10 may include a phase-frequency detector 100, a charge pump 110, a loop filter 120, a voltage-controlled oscillator (VCO) 130, and a divider 140.

The phase-frequency detector 100 may compare a division clock signal DCK obtained by dividing an output clock signal OCK with a reference clock signal RCK. The phase-frequency detector 100 may generate an up signal UP or a down signal DN having a pulse width corresponding to a phase difference between the division clock signal DCK and the reference clock signal RCK. The divider 140 may divide the output clock signal OCK and may generate the division clock signal DCK to compare the phase of the reference clock signal RCK with that of the output clock signal OCK.

The phase-frequency detector 100 may increase the pulse width of the up signal UP as the phase of the division clock signal DCK trails that of the reference clock signal RCK. The phase-frequency detector 100 may increase the pulse width of the down signal DN as the phase of the division clock signal DCK leads that of the reference clock signal RCK. Here, the up signal UP may advance the phase of the output clock signal OCK, while the down signal DN may retard the phase of the output clock signal OCK.

As described above, the phase-frequency detector 100 may output the up signal UP or the down signal DN of which pulse width is varied according to the phase difference between the reference clock signal RCK and the output clock signal OCK.

The charge pump 110 may pump a voltage according to the pulse widths of the up and down signals UP and DOWN and generate a first control voltage Vc1. The charge pump 110 may increase a level of the first control voltage Vc1 with an increase in the pulse width of the up signal UP. The charge pump 110 may decrease the level of the first control voltage Vc1 with a reduction in the pulse width of the down signal DOWN.

The loop filter 120 may remove a high-frequency component from the first control voltage Vc1 and generate a second control voltage Vc2.

The VCO 130 may oscillate one of output clock signals OCK having various frequencies, which may have a frequency corresponding to the level of the second control voltage Vc2.

As described above, the clock generating circuit 10 may oscillate the output clock signal OCK having a predetermined frequency in synchronization with the reference clock signal RCK. Although not shown, the output clock signal OCK oscillated by the clock generating circuit 10 may be transmitted to internal circuits of the system.

The lock detector 15 may include a lock enable signal generator 152 and an unlock enable signal generator 154. The lock enable signal generator 152 may determine a lock state where the phase of the reference clock signal RCK is equal to that of the output clock signal OCK based on a first reference value. The unlock enable signal generator 154 may determine an unlock state where the phase of the reference clock signal RCK is not equal to that of the output clock signal OCK based on a second reference value. In other words, the lock detector 15 may determine with hysteresis whether the PLL circuit 1 is in the lock state or the unlock state based on different reference values.

Figure 2:
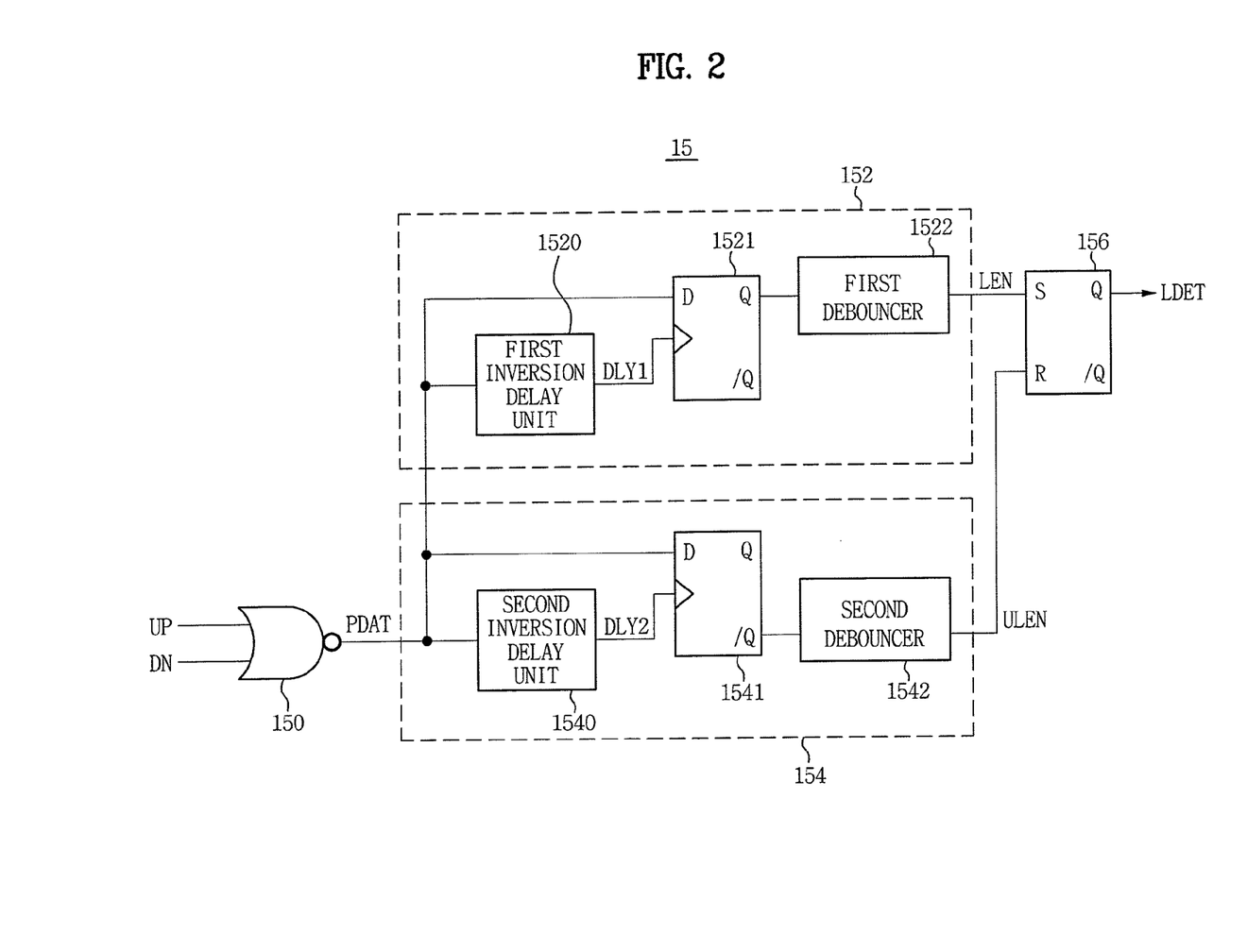
FIG. 2 illustrates a detailed block diagram of an exemplary embodiment of the lock detector employable by the PLL circuit of FIG. 1.

FIG. 2 illustrates a detailed block diagram of an exemplary embodiment of the lock detector 15 employable by the PLL circuit 1 of FIG. 1.

Referring to FIG. 2, the lock detector 15 may include a NOR gate 150, the lock enable signal generator 152, the unlock enable signal generator 154, and an SR latch 156.

The NOR gate 150 may receive the up signal UP and the down signal DOWN, perform a logic exclusive NOR on the up signal UP and the down signal DOWN, and output phase difference data PDAT. As stated above, the pulse widths of the up signal UP and the down signal DOWN may depend on a phase difference between the reference clock signal RCK and the output clock signal OCK. Thus, the NOR gate 150 may control the pulse widths of the up signal UP and the down signal DOWN according to the phase difference between the reference clock signal RCK and the output clock signal OCK in response to the up signal UP and the down signal DOWN and output the phase difference data PDAT.

The lock enable signal generator 152 may include a first inversion delay unit 1520, a first D-flip-flop 1521, and a first debouncer 1522. The first inversion delay unit 1520 may receive the phase difference data PDAT, delay the phase difference data PDAT by a first reference value, invert the delayed phase difference data PDAT, and output the inverted phase difference data PDAT as a first delay signal DLY 1. The first D-flip-flop 1521 may output the received phase difference data PDAT in synchronization with the first delay signal DLY1 through an output terminal Q. When the pulse of the output signal of the first D-flip-flop 1521 is oscillated, a malfunction may occur in the SR latch 156 due to the pulse oscillation. Thus, the first debouncer 1522 may previously remove a noise component, such as the pulse oscillation, from the output signal of the first D-flip-flop 1521 and generate a lock enable signal LEN.

The unlock enable signal generator 154 may include a second inversion delay unit 1540, a second D-flip-flop 1541, and a second debouncer 1542. The second inversion delay unit 1540 may receive the phase difference data PDAT, delay the phase difference data PDAT by a second reference value, invert the delayed phase difference data PDAT, and output the inverted phase difference data PDAT as a second delay signal DLY2. The second D-flip-flop 1541 may output the received phase difference data PDAT in synchronization with the second delay signal DLY2 through the output terminal /Q. When the pulse of the output signal of the second D-flip-flop 1541 is oscillated, a malfunction may occur in the SR latch 156 due to the pulse oscillation. Thus, the second debouncer 1542 may previously remove a noise component, such as the pulse oscillation, from the output signal of the second D-flip-flop 1541 and generate an unlock enable signal ULEN. Here, it may be determined that the second reference value is greater than the first reference value.

The SR latch 156 may receive the lock enable signal LEN through a set terminal S and receive the unlock enable signal ULEN through a reset terminal R. The SR latch 156 may enable a lock detection signal LDET to a high level when the lock enable signal LEN is enabled to a high level. The SR latch 156 may disable the lock detection signal LDET to a low level when the unlock enable signal ULEN is enabled to a high level.

Figure 3:
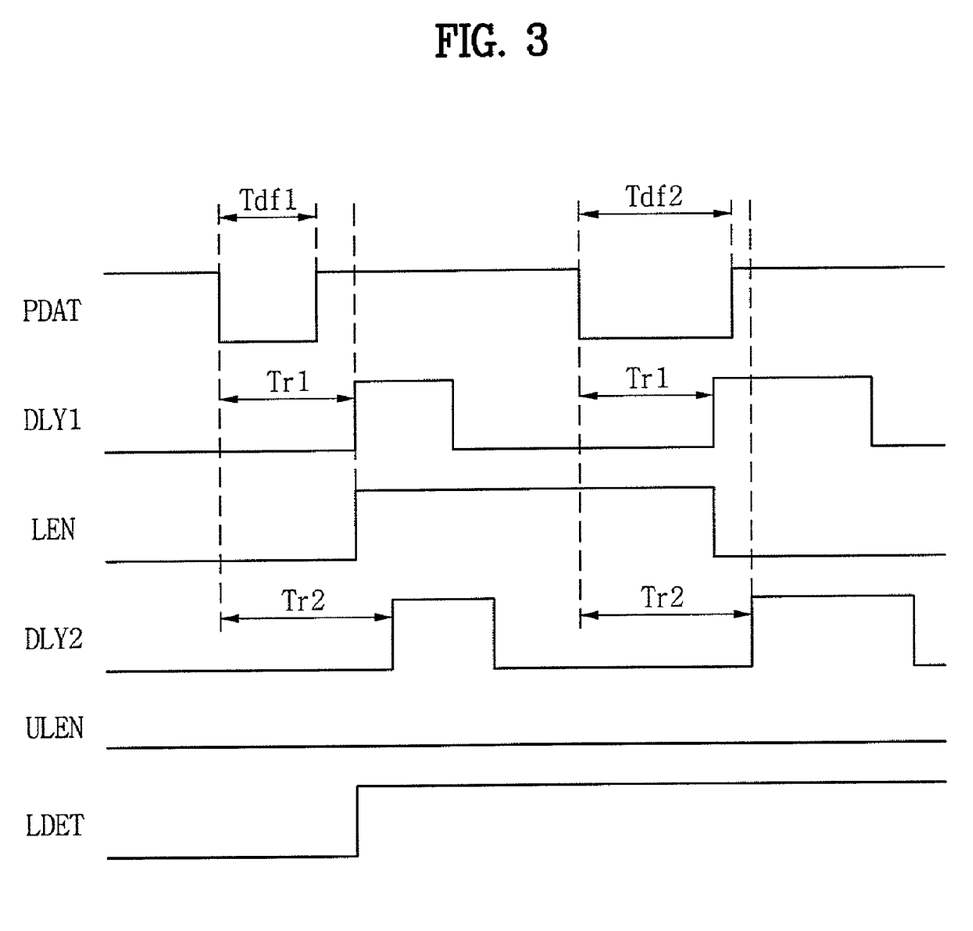
FIG. 3 illustrates a timing diagram of an exemplary operation of the lock detector of FIG. 2.
Figure 4:
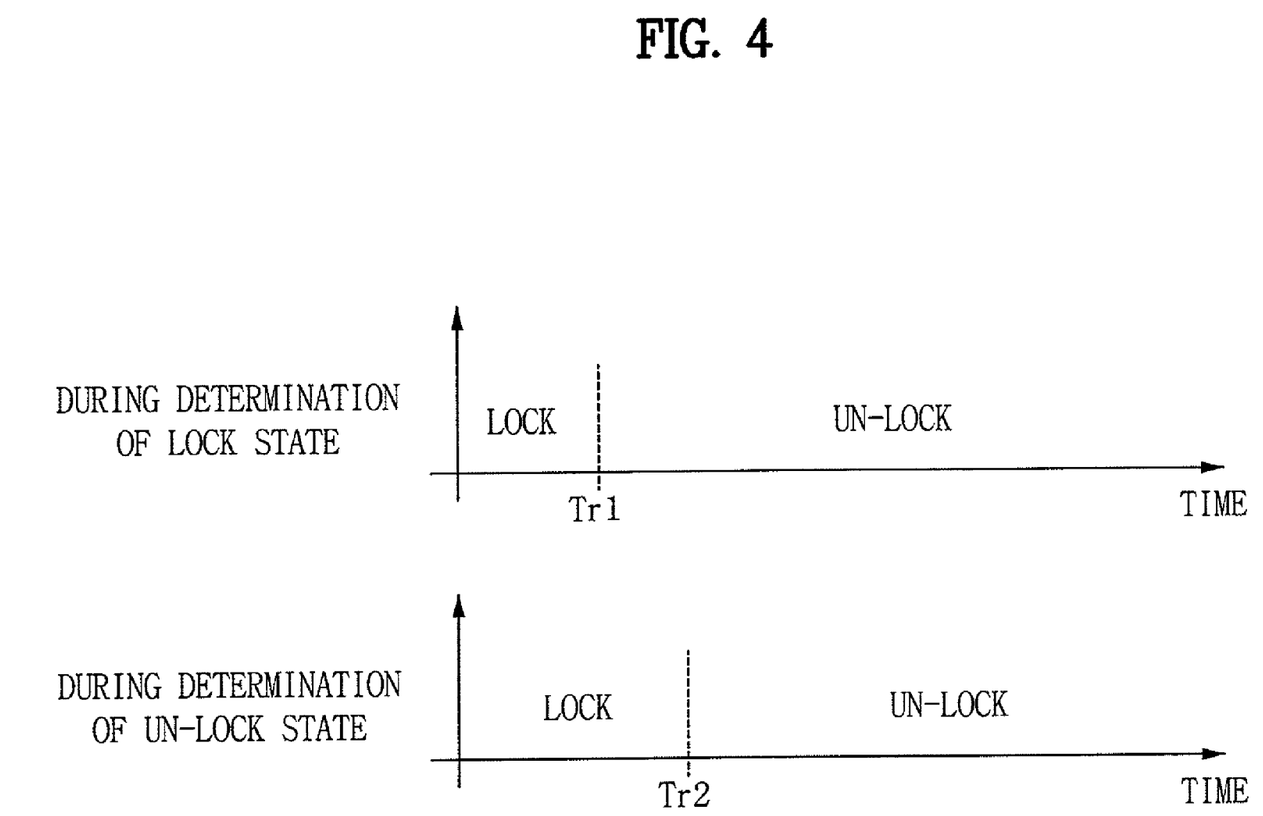
FIG. 4 illustrates a diagram showing first and second reference values of the lock detector of FIG. 2.

Exemplary operation of the lock detector 15 will now be described in further detail with reference to FIGS. 2 through 4. FIG. 3 illustrates a timing diagram of an exemplary operation of the lock detector 15 of FIG. 2. FIG. 4 illustrates a diagram showing first and second reference values of the lock detector 15 of FIG. 2.

Referring to FIGS. 2 and 3, when a phase difference between a reference clock signal RCK and an output clock signal OCK is a first phase difference Tdf1, the NOR gate 150 may generate phase difference data PDAT having the first phase difference Tdf1 in response to an up signal UP and a down signal DN. In this case, the first inversion delay unit 1520 of the lock enable signal generator 152 may delay the phase difference data PDAT by a first reference value Tr1 and output a first delay signal DLY1. Referring to FIG. 3, the first D-flip-flop 1521 may be triggered by a rising edge of the first delay signal DLY1 and may output a high-level output signal through the output terminal Q.

In this case, the first D-flip-flop 1521 may output the high-level output signal when the first phase difference Tdf1 is less than the first reference value Tr1. The first D-flip-flop 1521 may output a low-level output signal when the first phase difference Tdf1 is more than the first reference value Tr1. That is, the first D-flip-flop 1521 may compare the first phase difference Tdf1 with the first reference value Tr1 and output an output signal having a different voltage level based on the comparison result.

Meanwhile, when a voltage level of the output signal of the first D-flip-flop 1521 is changed, a noise component, such as pulse oscillation, may be generated, thus making the operation of the SR latch 156 unstable. Thus, the first debouncer 1522 may previously remove the noise component from the output signal of the first D-flip-flop 1521 and transmit the output signal of the first D-flip-flop 1521, which may have a stable voltage level. When the first phase difference Tdf1 is less than the first reference value Tr1, the first D-flip-flop 1521 may output a high-level output signal so that the first debouncer 1522 may output the lock enable signal LEN at a high level. Thus, the SR latch 156 may enable the lock detection signal LDET to a high level in response to the high-level lock enable signal LEN. As described above, when the first phase difference Tdf1 is less than the first reference value Tr1, the lock detector 15 may determine that the PLL circuit is in the lock state and enable the lock detection signal LDET.

Meanwhile, the second inversion delay unit 1540 of the unlock enable signal generator 154 may delay the phase difference data PDAT by a second reference value Tr2 and output a second delay signal DLY2. The second D-flip-flop 1541 may be triggered by a rising edge of the second delay signal DLY2 and may output a low-level output signal. That is, referring to the exemplary embodiment of FIG. 3, since the first phase difference Tdf1 is less than the second reference value Tr2, the second D-flip-flop 1541 may output the low-level output signal through the output terminal /Q. As described above, the unlock enable signal generator 154 may output a level-inverted signal of the output signal of the lock enable signal generator 152 based on the same comparison result. The second debouncer 1542 may remove a noise component from the output signal of the second D-flip-flop 1541 and output an unlock enable signal ULEN at a low level.

The SR latch 156 may enable the lock detection signal LDET in response to the high-level lock enable signal LEN.

Next, when a phase difference between the reference clock signal RCK and the output clock signal OCK is a second phase difference Tdf2, the pulse width of the phase difference data PDAT may become the second phase difference Tdf2.

The first inversion delay unit 1520 of the lock enable signal generator 152 may delay the second phase difference Tdf2 by the first reference value Tr1 and output a first delay signal DLY1. Since the second phase difference Tdf2 is greater than the first reference value Tr1, the first D-flip-flop 1521 may output a low-level output signal in synchronization with the first delay signal DLY1. The first debouncer 1522 may remove a noise component from the output signal of the first D-flip-flop 1521 and output a lock enable signal LEN at a low level.

The second inversion delay unit 1540 of the unlock enable signal generator 154 may delay the second phase difference Tdf2 by the second reference value Tr2 and output a second delay signal DLY2. Since the second phase difference Td12 is less than the second reference value Tr2, the second D-flip-flop 1541 may output a low-level output signal in synchronization with the second delay signal DLY2. The second debouncer 1542 may remove a noise component from the output signal of the second D-flip-flop 1541 and output an unlock enable signal ULEN at a low level.

Thus, the SR latch 156 may maintain the lock detection signal LDET at a high level in response to the lock enable signal LEN and the unlock enable signal ULEN that are both disabled to a low level. That is, since the second phase difference Tdf2 is not greater than the second reference value Tr2 required to determine the unlock state, the lock detector 15 may continuously determine that the PLL circuit is in the lock state and maintain the lock detection signal LDET enabled.

As described above, the lock enable signal generator 152 may use the first reference value Tr1 to determine whether the PLL circuit 1 is in the lock state, while the unlock enable signal generator 154 may use the second reference value Tr2 to determine whether the PLL circuit 1 is in the unlock state.

Referring to FIG. 4, the lock detector 15 may determine that the PLL circuit 1 is in the lock state based on the first reference value Tr1. Conversely, the lock detector 15 may determine that the PLL circuit 1 is in the unlock state based on the second reference value Tr2 that is greater than the first reference value Tr1. Therefore, if a phase difference between the reference clock signal RCK and the output clock signal OCK is instantaneously increased even slightly, the lock state may not be easily changed into the unlock state. Thus, since the first reference value Tr1 may not be set as a great value in consideration of noise, the first reference value Tr1 may be set as a small value so that the lock detector 15 may determine more precisely whether the PLL circuit 1 is in the lock state or not.

Referring to FIGS. 3 and 4, one or more embodiments may provide a method of determining a lock or unlock state of a PLL circuit, e.g., PLL circuit 1 of FIG. 1. More particularly, it may first be determined whether a PLL circuit, e.g., PLL circuit 1, is in a lock state using the first reference value Tr1. For example, in one or more embodiments, it may be determined that the PLL circuit is in a lock state if a first condition is met, e.g., when a phase difference between a reference clock signal RCK and an output clock signal OCK (e.g., a first phase difference Tdf1) output from the PLL circuit is less than or equal to a first reference value Tr1. In such embodiments, e.g., once it is determined that the PLL circuit is in a lock state, it may then be determined whether the PLL circuit has changed to an unlock state using the second reference value Tr2. For example, in or more embodiments, it may be determined that the PLL circuit is in an unlock state if a second condition is met, e.g., when a phase difference between the reference clock signal RCK and an output clock signal OCK (e.g., a second phase difference Tdf2) is greater than a second reference value Tr2. For example, in such embodiments, even if the second phase difference Tdf2 is greater than the first reference value Tr1, it may be continued to be determined that the PLL circuit is in a lock state so long as the second phase difference Tdf2 is less than the second reference value Tr2.

One or more embodiments of a PLL circuit, e.g., the PLL circuit 1, may operate with hysteresis to determine whether the PLL circuit, e.g., 1, is in the lock state or the unlock state. One or more embodiments may provide a lock detector configured to determine a lock state of a PLL circuit more precisely and may reduce and/or prevent a lock state from being inadvertently changed into an unlock state due to, e.g., noise.

Figure 5:
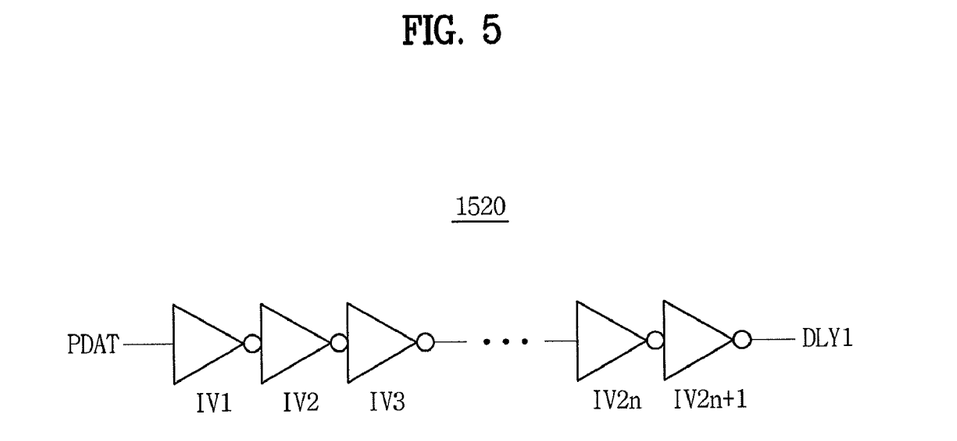
FIG. 5 illustrates a circuit diagram of an exemplary embodiment of the first inversion delay unit employable by the lock detector of FIG. 2.

FIG. 5 illustrates a circuit diagram of an exemplary embodiment of the first inversion delay unit 1520 employable by the lock detector 15 of FIG. 2.

Referring to FIG. 5, the first inversion delay unit 1520 of the lock enable signal generator 152 may include an inversion chain having an odd number of inverters IV1 to IV2$n$+1. Although not illustrated, the second inversion delay unit 1540 of the unlock enable signal generator 154 may include an inverter chain having an odd number of inverters. In embodiments, to delay phase difference data PDAT by a second reference value Tr2 that is greater than a first reference value Tr1, the second inversion delay unit 1540 may include a greater number of inverters than the first inversion delay unit 1520.

Figure 6:
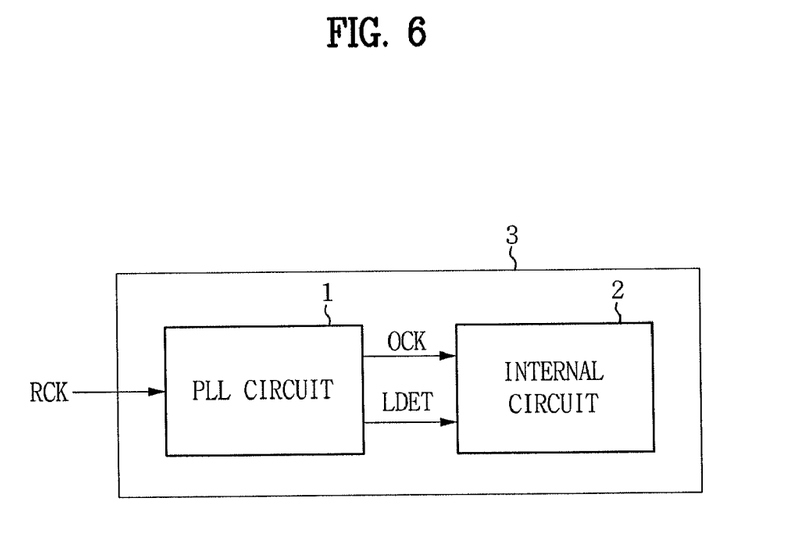
FIG. 6 illustrates a block diagram of an exemplary embodiment of a system including a PLL circuit.

FIG. 6 illustrates a block diagram of an exemplary embodiment of a system 3 including the PLL circuit 1 of FIG. 1. Referring to FIG. 6, the system 3 may include the PLL circuit 1 and an internal circuit 2.

The PLL circuit 1 may generate an output clock signal OCK having a predetermined frequency in synchronization with a reference clock signal RCL. In embodiments, since the PLL circuit 1 operates with hysteresis to determine a lock or unlock state where the phase of a reference clock signal RCK is equal or unequal to that of an output clock signal OCK, the PLL circuit 1 may determine the lock or unlock state more precisely and output a lock detection signal LDET that is substantially and/or completely resistant to noise. That is, the PLL circuit 1 may output a highly reliable lock detection signal LDET.

The internal circuit 2 may perform internal operations in synchronization with the output clock signal OCK when the lock detection signal LDET is enabled, and interrupt the internal operations synchronized with the output clock signal OCK when the lock detection signal LDET is disabled.

One or more embodiments may provide a PLL circuit and a system including such a PLL circuit that may determine with hysteresis whether the PLL circuit or the system is in a lock state or an unlock state. One or more embodiments may provide a PLL circuit and a system including such a PLL circuit that is configured to determine a lock state more precisely as compared to comparable conventional PLL circuits or lock detection mechanisms. One or more embodiments may provide a PLL circuit and a system including such a PLL circuit that is configured to reduce and/or prevent a lock state from being readily and/or inadvertently changed into the unlock state due to noise. One or more embodiments may provide a lock detector adapted to receive clock signals from other circuits such as a PLL circuit and may determine a lock or unlock state of the PLL circuit with improved stability as a result of the more precise determination of the lock state or unlock state of the PLL circuit. One or more embodiments may enable circuits configured to receive clock signals from a PLL circuit to operate with improved stability by employing such a lock detector configured to more precisely determine a lock state or unlock state of the PLL circuit.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A phase locked loop (PLL) state detector employable with a PLL circuit including a clock generating circuit configured to generate an output clock signal having a predetermined frequency in synchronization with a reference clock signal, the PLL state detector comprising:
    a lock detector configured to determine that the PLL circuit is in a lock state when a phase difference between the reference clock signal and the output clock signal is equal to or less than a first reference value, determine that the PLL circuit is in an unlock state when the phase difference between the reference clock signal and the output clock signal is greater than a second reference value, and generate a lock detection signal, wherein the lock detector includes:
        a logic gate configured to generate phase difference data of which pulse width is controlled according to the phase difference between the reference clock signal and the output clock signal,
        a lock enable signal generator configured to determine that the system is in the lock state when the pulse width of the phase difference data is equal to or less than the first reference value and enable a lock enable signal, and
        an unlock enable signal generator configured to determine that the system is in the unlock state when the pulse width of the phase difference data is greater than the first reference value and enable an unlock enable signal.

2. The PLL state detector as claimed in claim 1, wherein the second reference value is greater than the first reference value.

3. The PLL state detector as claimed in claim 1, wherein the clock generating circuit of the PLL circuit comprises:
    a phase-frequency detector configured to generate an up signal and a down signal according to a phase difference between a division clock signal obtained by dividing the output clock signal and the reference clock signal, control a pulse width of the up signal when the phase of the division clock signal trails that of the reference clock signal, and control a pulse width of the down signal when the phase of the division clock signal leads that of the reference clock signal;
    a charge pump configured to pump a voltage according to the pulse widths of the up signal and the down signal and generate a control voltage; and
    a voltage-controlled oscillator (VCO) configured to vary the frequency of the output clock signal in response to the control voltage.

4. The PLL state detector as claimed in claim 1, wherein the lock detector includes:
    an SR latch configured to enable the lock detection signal in response to the lock enable signal and disable the lock detection signal in response to the unlock enable signal.

5. The PLL state detector as claimed in claim 4, wherein the lock enable signal generator comprises:
    a first inversion delay unit configured to delay the phase difference data by the first reference value, invert the delayed phase difference data, and generate a first delay signal;
    a first D-flip-flop configured to output the phase difference data in synchronization with the first delay signal; and
    a first debouncer configured to remove a noise component from an output signal of the first D-flip-flop and output the lock enable signal.

6. The PLL state detector as claimed in claim 4, wherein the unlock enable signal generator comprises:
    a second inversion delay unit configured to delay the phase difference data by the second reference value, invert the delayed phase difference data, and generate a second delay signal;
    a second D-flip-flop configured to output the phase difference data in synchronization with the second delay signal; and a second debouncer configured to remove a noise component from an output signal of the second D-flip-flop and output the unlock enable signal.

7. The PLL state detector as claimed in claim 4, wherein the lock enable signal generator includes an inversion chain having an n inverters, and the unlock enable signal generator includes an inversion chain having an m inverters, where n and me are odd numbers and m is greater than n.

8. The PLL state detector as claimed in claim 4, wherein the logic gate is a NOR gate.

9. A system, comprising:
   a clock generating circuit configured to generate an output clock signal having a predetermined frequency in synchronization with a reference clock signal;
   a lock detector configured to determine that the system is in a lock state when a phase difference between the reference clock signal and the output clock signal is equal to or less than a first reference value, and determine that the system is in an unlock state when the phase difference between the reference clock signal and the output clock signal is greater than a second reference value, wherein the lock detector includes:
      a logic gate configured to generate phase difference data of which pulse width is controlled according to the phase difference between the reference clock signal and the output clock signal,
      a lock enable signal generator configured to determine that the system is in the lock state when the pulse width of the phase difference data is equal to or less than the first reference value and enable a lock enable signal, and
      an unlock enable signal generator configured to determine that the system is in the unlock state when the pulse width of the phase difference data is greater than the second reference value and enable an unlock enable signal; and
   an internal circuit configured to perform an internal operation in synchronization with the output clock signal when the system is in the lock state.

10. The system as claimed in claim 9, wherein the second reference value is greater than the first reference value.

11. The system as claimed in claim 9, wherein the clock generating circuit comprises:
   a phase-frequency detector configured to generate an up signal and a down signal according to a phase difference between a division clock signal obtained by dividing the output clock signal and the reference clock signal, control a pulse width of the up signal when the phase of the division clock signal trails that of the reference clock signal, and control a pulse width of the down signal when the phase of the division clock signal leads that of the reference clock signal;
   a charge pump configured to pump a voltage according to the pulse widths of the up signal and the down signal and generate a control voltage; and
   a VCO configured to vary the frequency of the output clock signal in response to the control voltage.

12. The system as claimed in claim 9, wherein the lock detector includes:
   an SR latch configured to enable the lock detection signal in response to the lock enable signal and disable the lock detection signal in response to the unlock enable signal.

13. The system as claimed in claim 12, wherein the lock enable signal generator comprises:

a first inversion delay unit configured to delay the phase difference data by the first reference value, invert the delayed phase difference data, and generate a first delay signal;
a first D-flip-flop configured to output the phase difference data in synchronization with the first delay signal; and
a first debouncer configured to remove a noise component from an output signal of the first D-flip-flop and output the lock enable signal.

14. The system as claimed in claim 12, wherein the unlock enable signal generator comprises:
   a second inversion delay unit configured to delay the phase difference data by the second reference value, invert the delayed phase difference data, and generate a second delay signal;
   a second D-flip-flop configured to output the phase difference data in synchronization with the second delay signal; and
   a second debouncer configured to remove a noise component from an output signal of the second D-flip-flop and output the unlock enable signal.

15. The system as claimed in claim 12, wherein the lock enable signal generator includes an inversion chain having an n inverters, and the unlock enable signal generator includes an inversion chain having an m inverters, where n and me are odd numbers and m is greater than n.

16. The system as claimed in claim 12, wherein the logic gate is a NOR gate.

17. A lock detection method of a phase locked loop (PLL) circuit, comprising a clock generating circuit configured to generate an output clock signal having a predetermined frequency in synchronization with a reference clock signal, and a lock detector configured to determine that the PLL circuit is in a lock state or in an unlock state according to a phase difference between the reference clock signal and the output clock signal, and generate a lock detection signal,
   the method comprising:
      using a logic gate to generate phase difference data of which pulse width is controlled according to the phase difference between the reference clock signal and the output clock signal;
      determining that the PLL circuit is in the lock state when the pulse width of the phase difference data is equal to or less than a first reference value and enabling the lock detection signal; and
      determining that the PLL circuit is in the unlock state when the pulse width of the phase difference data is greater than a second reference value and disabling the lock detection signal.

18. The method as claimed in claim 17, wherein the second reference value is greater than the first reference value.

19. The method as claimed in claim 17, further comprising:
   after determining that the PLL circuit is in the lock state, maintaining the determination that the PLL circuit is in the lock state when the pulse width of the phase difference between the reference clock signal and the output clock signal is equal to or less than the first reference value and the lock detection signal is disabled.

20. The method as claimed in claim 19, wherein determining that the PLL circuit is in the unlock state, after being in the lock state, is based only on the whether the pulse width of the phase difference between the reference clock signal and the output clock signal is greater than the second reference value.

* * * * *